(12) United States Patent
Lin et al.

(10) Patent No.: US 12,020,896 B2
(45) Date of Patent: Jun. 25, 2024

(54) INSULATOR FOR AN ION IMPLANTATION SOURCE

(71) Applicant: Taiwan Semiconductor Manufacturing Company, Ltd., Hsinchu (TW)

(72) Inventors: Tsung-Min Lin, Zhubei (TW); Sheng-Chi Lin, Hsinchu (TW); Jui-Feng Jao, Miaoli (TW); Fang-Chi Chien, Hsinchu (TW); Lung-Yin Tang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 16/947,430

(22) Filed: Jul. 31, 2020

(65) Prior Publication Data

US 2022/0037115 A1    Feb. 3, 2022

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/038* (2013.01)

(58) Field of Classification Search
CPC ... H01J 37/3171; H01J 37/08; H01J 2237/038
See application file for complete search history.

(56) References Cited

U.S. PATENT DOCUMENTS

| 5,675,152 | A  | * | 10/1997 | Wong | ............... | H01J 27/08 |
| | | | | | | 250/427 |
| 9,281,160 | B2 | * | 3/2016 | Sato | ............... | H01J 27/024 |
| 2005/0151089 | A1 | * | 7/2005 | Bong | ............... | H01J 37/08 |
| | | | | | | 250/396 R |
| 2007/0262270 | A1 | * | 11/2007 | Huang | ............... | H01J 37/04 |
| | | | | | | 250/492.21 |
| 2008/0230713 | A1 | * | 9/2008 | Huang | ............... | H01J 37/08 |
| | | | | | | 250/426 |
| 2010/0072402 | A1 | * | 3/2010 | Satoh | ............... | H01J 37/04 |
| | | | | | | 250/492.21 |
| 2015/0270100 | A1 | * | 9/2015 | Jerez | ............... | H01J 37/08 |
| | | | | | | 250/396 R |
| 2017/0140895 | A1 | * | 5/2017 | Burgess | ............... | H01J 37/08 |
| 2018/0138006 | A1 | * | 5/2018 | Baggett | ............... | H01J 37/08 |
| 2018/0261434 | A1 | * | 9/2018 | Kawaguchi | ............... | C23C 14/48 |

FOREIGN PATENT DOCUMENTS

JP     H0227653 U  *  2/1990
JP     H0922675 A  *  1/1997

* cited by examiner

*Primary Examiner* — Michael J Logie
(74) *Attorney, Agent, or Firm* — Harrity & Harrity, LLP (57) ABSTRACT

An insulator for an ion implantation source may provide electrical insulation between high voltage components and relatively lower voltage components of the ion implantation source. To reduce the likelihood of and/or prevent a leakage path forming along the insulator, the insulator may include an internal cavity having a back and forth pattern. The back and forth pattern of the internal cavity increases the mean free path of gas molecules in the ion implantation source and increases the surface area of the insulator that is not directly or outwardly exposed to the gas molecules. This results in a continuous film or coating being more difficult and/or less likely to form along the insulator, which extends the working time of the ion implantation source.

20 Claims, 7 Drawing Sheets

INSULATOR FOR AN ION IMPLANTATION SOURCE

BACKGROUND

An ion implantation tool is a semiconductor processing tool that is used to implant ions into a substrate such as a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An ion implantation tool generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam.

The arc voltage supplied to the arc chamber to ignite the plasma is typically a much lower voltage compared to the extraction voltage supplied to the extraction electrodes. For example, arc voltages may range from 30V to a few hundred volts (positive or negative), whereas the extraction voltage can be 10's of kilovolts or more. The difference in electrical potential between the arc voltage and the extraction voltage can result in electrical arcing between the conductor carrying the extraction voltage and other components of the ion source head of the ion implantation tool that are at the arc voltage potential. Electrical arcing may result in damage to the ion implantation tool, reduced ion dissociation performance, an unstable ion beam, and other performance issues.

An insulator may be provided between the conductor carrying the extraction voltage and other components of the ion source head that are at the arc voltage potential. The insulator provides electrical isolation between the extraction voltage conductor and a component at the arc voltage potential.

However, a leakage path may form between the extraction voltage conductor and a component at the arc voltage potential, which may decrease or negate the isolation benefits of the insulator. The leakage path may occur due to a continuous film or coating forming along the insulator from the extraction voltage conductor to the component at the arc voltage potential.

Some implementations described herein provide an insulator for an ion implantation source. The insulator may provide electrical insulation between high voltage components and relatively lower voltage components of the ion implantation source. To reduce the likelihood of and/or prevent a leakage path forming along the insulator, the insulator may include an internal cavity having a back and forth pattern. The back and forth pattern of the internal cavity increases the mean free path of gas molecules in the ion implantation source and increases the surface area of the insulator that is not directly or outwardly exposed to the gas molecules. This results in a continuous film or coating being more difficult and/or less likely to form along the insulator, which extends the working time of the ion implantation source.

Figure 1:
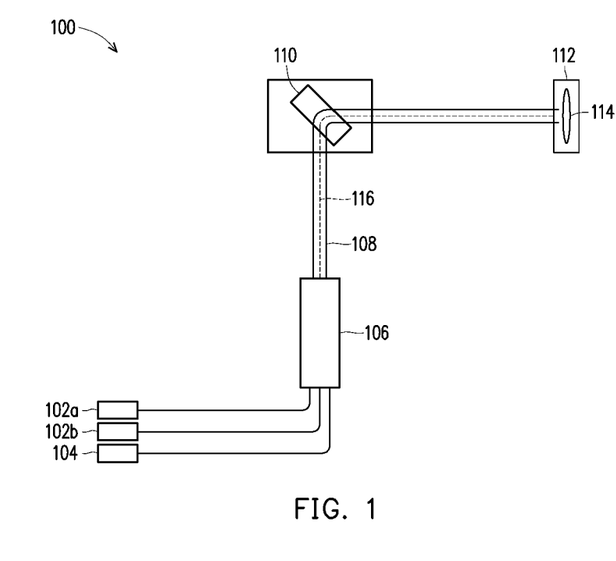
FIG. 1 is a diagram of an example ion implantation system described herein.

FIG. 1 is a diagram of an example ion implantation system 100 described herein. The ion implantation system 100 may be used to perform an ion implantation process for a substrate such as a semiconductor wafer. The ion implantation process may include implanting ions into the substrate to form one or more doped regions, such as a doped source region or a doped drain region of a transistor. As shown in FIG. 1, the ion implantation system 100 may include various components, such as one or more power supplies 102 (e.g., power supply 102a and power supply 102b), a gas source 104, an ion source head 106, a conduit 108, an analyzer 110, and a wafer handler 112. The wafer handler 112 may hold a wafer 114 to be implanted with ions using an ion beam 116 generated by the ion implantation system 100.

The power supply 102a may provide a relatively low voltage to the ion source head 106. As an example, the power supply 102a may provide a voltage in the range of 30 to 150 volts. The voltage provided by power supply 102a may be used as an arc voltage in an arc chamber of the ion source head 106. The power supply 102b may provide a relatively high voltage (e.g., relative to the voltage provided by power supply 102b) to the ion source head 106. As an example, the power supply 102b may provide a voltage in the range of 20 to 80 kilovolts. The voltage provided by the power supply 102b may be used as an extraction voltage for an extraction electrode of the ion source head 106. In some implementations, the power supply 102a and the power supply 102b are incorporated into the same power supplies.

In some implementations, the power supply 102a and the power supply 102b are separate power supplies. The gas source 104 may provide a source material in the form of a gas to the ion source head 106. The source material may include a dopant such as arsenic, boron, phosphorus, or another dopant for doping portions of the wafer 114.

The ion source head 106 may be a component that generates ions from the source material. In some implementations, ion source head may also be referred to as an ion implantation source, an ion source, or another term for a component that generates an ion gas. The ion source head 106 may receive the source material gas and may use the arc voltage provided by the power supply 102a to generate a plasma that ionizes the source material gas. The extraction voltage provided to the ion source head 106 by the power supply 102b is used to extract ions from the plasma. The extracted ions are formed into the ion beam 116, which travels through conduit 108 to analyzer 110. Analyzer 110 may include a mass analyzer or another type of analyzer that uses a magnetic field to filter the ion beam 116 such that ions having particular properties (e.g., ions of a particular size, ions of a particular charge, and/or the like) are passed through the analyzer 110.

The remaining ions in the ion beam 116 travel through the conduit 108 to the wafer 114 being held by the wafer handler 112. The wafer handler 112 may be a table, a plate, an electrostatic chuck, or another component configured to hold wafer 114 as the ion beam 116 implants ions into the wafer 114.

The number and arrangement of components shown in FIG. 1 are provided as an example. In practice, the ion implantation system 100 may include additional components, fewer components, different components, or differently arranged components than those shown in FIG. 1. Additionally, or alternatively, a set of components (e.g., one or more components) of the ion implantation system 100 may perform one or more functions described as being performed by another set of components of the ion implantation system 100.

Figure 2:
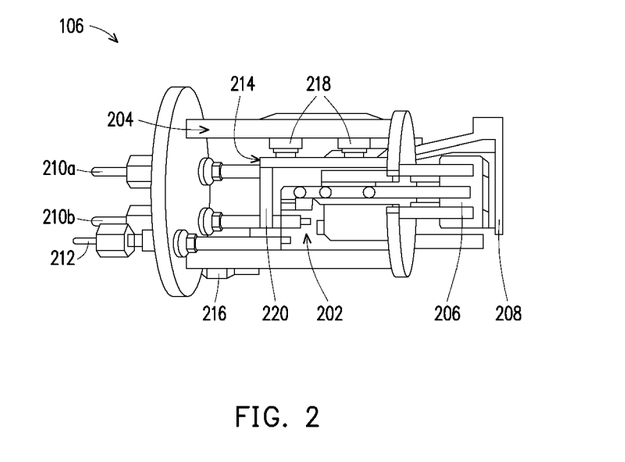
FIG. 2 is a diagram of an example ion source head described herein.

FIG. 2 is a diagram of an example ion source head 106 described herein. As shown in FIG. 2, the ion source head 106 may include various components, such as a supply chamber 202 having an outer wall 204, an arc chamber 206, an extraction electrode 208, one or more filaments 210, a bias electrode 212, an extraction voltage conductor 214, a gas supply line 216, one or more insulators 218, and an arc voltage conductor 220.

The arc voltage provided by the power supply 102a may enter the ion source head 106 through a filament 210 (e.g., filament 210a and filament 210b). The arc voltage may traverse along the arc voltage conductor 220 through the supply chamber 202 to the arc chamber 206. The supply material is provided by the gas source 104 to the ion source head 106 through gas supply line 216. The supply material may traverse through the supply chamber 202 to the arc chamber 206.

The supply material enters the arc chamber 206, and the arc voltage is provided from the arc voltage conductor 220 to an anode, and is discharged between the anode and a cathode. The arc voltage discharge causes electrons to traverse from the anode to the cathode. The bias electrode 212 may be used to control the electrical potential between the anode and the cathode. The electrons and the supply material ignite a plasma in the arc chamber 206. In the plasma, the electrons bombard and/or collide with electrons in the atoms of the supply material, which causes the formation of positive ions of the supply material.

The extraction voltage may be provided to the extraction electrode 208 via the extraction voltage conductor 214 through the supply chamber 202. The extraction voltage may be a negatively biased voltage that attracts the positive ions in the plasma. In this way, the extraction voltage being applied to the extraction electrode 208 causes the extraction electrode 208 to extract or draw out positive ions from the arc chamber 206. An acceleration electrode (not shown) of the ion implantation system 100 may accelerate the extracted ions into the ion beam 116.

The relatively large difference in electrical potential between the arc voltage and the extraction voltage can result in electrical arcing between the extraction voltage conductor 214 and components of the ion source head 106 that are at the electrical potential of the arc voltage, such as the outer wall 204 of the supply chamber 202, the gas supply line 216, the arc voltage conductor 220, and/or the arc chamber 206. Accordingly, the insulator(s) 218 may be disposed between the extraction voltage conductor 214 and one or more components of the ion source head 106 that are at the electrical potential of the arc voltage. In this way, the insulator(s) 218 provide electrical isolation and/or insulation between the extraction voltage conductor 214 and the one or more components of the ion source head 106 that are at the electrical potential of the arc voltage. This reduces the likelihood of electrical arcing between the extraction voltage conductor 214 and the one or more components of the ion source head 106 that are at the electrical potential of the arc voltage.

The number and arrangement of components shown in FIG. 2 are provided as an example. In practice, the ion source head 106 may include additional components, fewer components, different components, or differently arranged components than those shown in FIG. 2. Additionally, or alternatively, a set of components (e.g., one or more components) of the ion source head 106 may perform one or more functions described as being performed by another set of components of the ion source head 106.

Figure 3A:
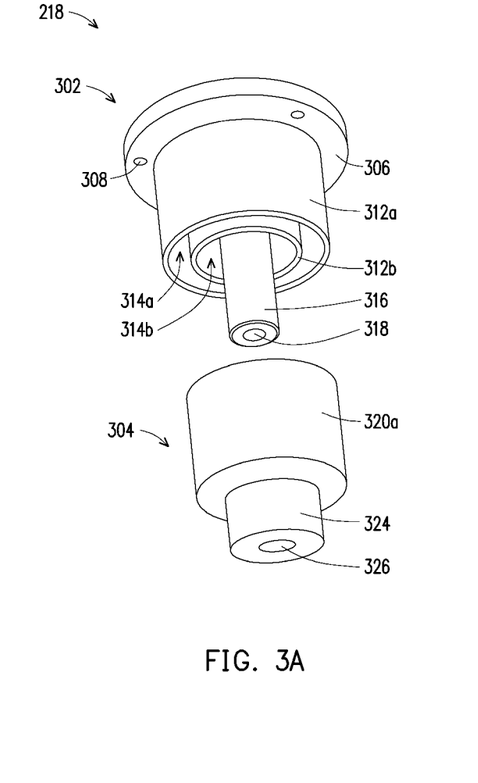
FIGS. 3A-3D are diagrams of an example insulator for an ion source head described herein.
Figure 3B:
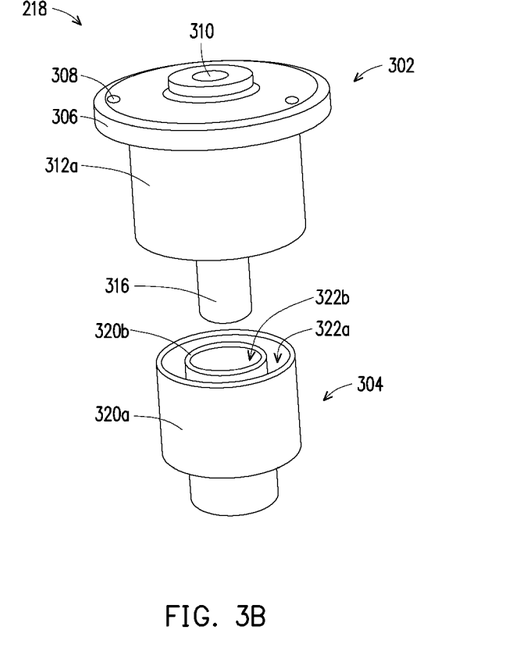
Figure 3C:
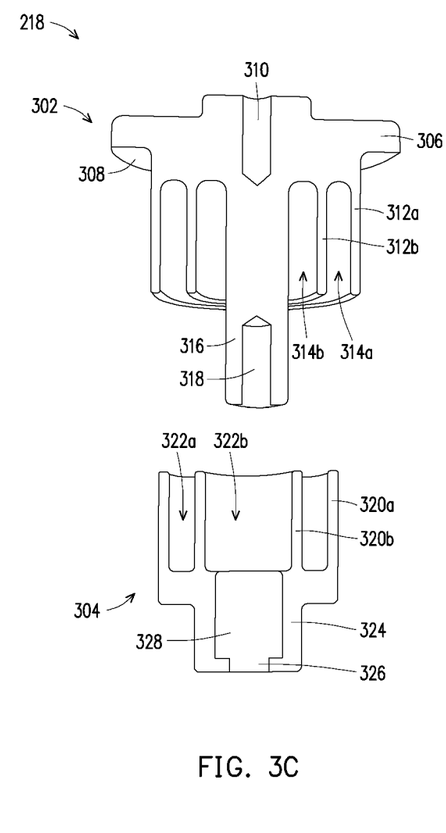
Figure 3D:
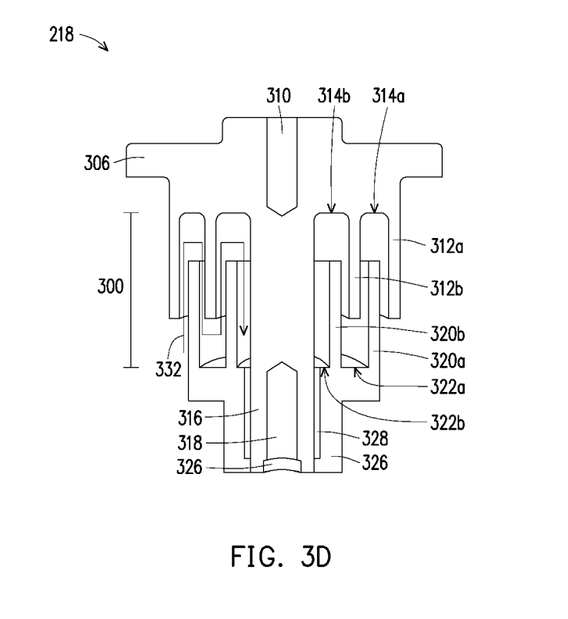

FIGS. 3A-3D are diagrams of an example insulator 218 described herein. FIGS. 3A and 3B illustrate exploded perspective views of the insulator 218. FIG. 3C illustrates an exploded cross-sectional view of the insulator 218. FIG. 3D illustrates an assembled cross-sectional view of the insulator 218. Insulator 218 may be formed of an insulating material, such as a ceramic, an aluminum oxide, or another insulating material.

As shown in FIGS. 3A and 3B, the insulator 218 may include an upper portion 302 and a lower portion 304. In some implementations, the lower portion 304 interfaces with the extraction voltage conductor 214 and the upper portion 302 interfaces with a component of the ion source head 106 that is at the electrical potential of the arc voltage. In some implementations, the lower portion 304 interfaces with a component of the ion source head 106 that is at the electrical potential of the arc voltage and the upper portion 302 interfaces with the extraction voltage conductor 214.

As further shown in FIGS. 3A and 3B, upper portion 302 may include a flange 306, one or more openings 308 positioned about the perimeter of the flange 306, and another opening 310 at the center of the flange 306. The opening(s) 308 and the opening 310 may be used to attached, connect, or secure the insulator 218 (e.g., the upper portion 302 of the insulator 218) to the extraction voltage conductor 214 or a component of the ion source head 106 that is at the electrical potential of the arc voltage. The upper portion 302 may be secured using various types of fasteners, such as bolts, rivets, screws, and/or the like.

As further shown in FIGS. 3A and 3B, the upper portion 302 may include one or more guide walls 312, such as a guide wall 312a and a guide wall 312b. The guide wall(s) 312 may extend from a surface of the flange 306 (e.g., opposite the surface of the flange 306 that interfaces with the extraction voltage conductor 214 or a component of the ion source head 106 that is at the electrical potential of the arc voltage). The guide wall(s) 312 may be circle shaped or ring shaped, as shown in FIGS. 3A-3D, or may be another shape such as square shaped, triangle shaped, non-standard shaped, and/or other the like. In some implementations, the upper portion 302 includes a plurality of guide walls 312 (e.g., two or more guide walls 312). In these examples, the plurality of guide walls 312 may be concentrically positioned (e.g., may be concentric guide walls). For example, the guide wall 312a may be an outer guide wall, and the guide wall 312b may be an inner guide wall that is positioned inward toward the core member 316 relative to the guide wall 312a.

As further shown in FIGS. 3A and 3B, the upper portion 302 may include one or more channels 314 formed by the one or more guide walls 312 and a core member 316 of the upper portion 302. For example, an outer channel 314a may be formed between the guide wall 312a and the guide wall 312b, and an inner channel 314b may be formed between the guide wall 312b and the core member 316. In some implementations, the upper portion 302 includes a plurality of channels 314 (e.g., two or more channels 314). In these examples, the plurality of channels 314 may be concentrically positioned (e.g., may be concentric channels). For example, the channel 314a may be an outer channel, and the channel 314b may be an inner channel that is positioned inward toward the core member 316 relative to the channel 314a.

The core member 316 may be an elongated member that extends substantially parallel to the guide walls(s) 312 and the channel(s) 314. The core member 316 may at least partially extend into lower portion 304 when the insulator 218 is assembled (e.g., when upper portion 302 and lower portion 304 are coupled). An opening 318 may be formed in an end of the core member 316 to permit a fastener to attach, connect, or secure the insulator 218 to the extraction voltage conductor 214 or a component of the ion source head 106 that is at the electrical potential of the arc voltage. In this way, the opening 310 and the opening 318 permit the insulator 218 to be secured at opposing ends of the insulator 218 (e.g., opening 310 may be used to secure the insulator 218 at a first end of the insulator 218, and opening 318 may be used to secure the insulator 218 at a second end of the insulator 218 opposing the first end).

As further shown in FIGS. 3A and 3B, the lower portion 304 may include one or more guide walls 320, such as a guide wall 320a and a guide wall 320b, and one or more channels 322, such as a channel 322a and a channel 322b. The guide wall(s) 320 and the channel(s) 322 may extend from a stepped section 324 of the lower portion 304. The stepped section 324 permits the lower portion 304 to be inserted into a recess in the extraction voltage conductor 214 or a component of the ion source head 106 that is at the electrical potential of the arc voltage. Moreover, an opening 326 may be formed through a bottom of the stepped section 324 to permit a fastener to be inserted through stepped section 324 and into the opening 318 in core member 316.

The guide wall(s) 320 may be circle shaped or ring shaped, as shown in FIGS. 3A-3D, or may be another shape such as square shaped, triangle shaped, non-standard shaped, and/or other the like. Similarly, the channel(s) 322 may be circle shaped or ring shaped, as shown in FIGS. 3A-3D, or may be another shape such as square shaped, triangle shaped, non-standard shaped, and/or other the like. In some implementations, the shapes of the guide wall(s) 312 and the guide wall(s) 320 may be substantially the same shape to permit compatibility of the upper portion 302 and the lower portion 304 (e.g., to permit the upper portion 302 and the lower portion 304 to be coupled such that the insulator 218 may be assembled).

In some implementations, the lower portion 304 includes a plurality of guide walls 320 (e.g., two or more guide walls 312). In these examples, the plurality of guide walls 320 may be concentrically positioned (e.g., may be concentric guide walls). For example, the guide wall 320a may be an outer guide wall, and the guide wall 320b may be an inner guide wall that is positioned inward toward the center of the lower portion 304 relative to guide wall 320a. In some implementations, the lower portion 304 includes a plurality of channels 322 (e.g., two or more channels 322). In these examples, the plurality of channels 322 may be concentrically positioned (e.g., may be concentric channels). For example, the channel 322a may be an outer channel, and the channel 322b may be an inner channel that is positioned inward toward the center of lower portion 304 relative to the channel 322a.

In some implementations, the quantity of the guide wall(s) 312 and the quantity of the guide wall(s) 320 are the same quantity. In some implementations, the quantity of the guide wall(s) 312 and the quantity of the guide wall(s) 320 are different quantities. In some implementations, the quantity of the channel(s) 314 and the quantity of the channel(s) 322 are the same quantity. In some implementations, the guide wall(s) 312 and/or the guide wall(s) 320 may be straight walls, may be angled walls, may be curved walls, or may be formed of another shape.

In some implementations, the quantity of the channel(s) 314 and the quantity of the channel(s) 322 are different quantities. In some implementations, the width of each of the channel(s) 314 and the width of each of the channel(s) 322 may be greater than 1 millimeter to increase the electrical isolation between the extraction electrode voltage and the arc voltage. In some implementations, each of the channel(s) 314 may be the same width. In some implementations, one or more of the channel(s) 314 may be different widths. In some implementations, each of the channel(s) 322 may be the same width. In some implementations, one or more of the channel(s) 322 may be different widths. In some implementations, the channel(s) 314 and the channel(s) 322 may be the same width. In some implementations, one or more of the channel(s) 314 and one or more of the channel(s) 322 may be different widths.

As shown in FIG. 3C, a recess 328 may be formed internally in the stepped section 324 of the lower portion 304. As shown in FIG. 3D, the core member 316 may be at least partially inserted in the recess 328 when the upper portion 302 and the lower portion 304 are coupled to assemble the insulator 218. As described above, a fastener may be inserted through the opening 326 in the stepped section 324 of the lower portion 304, and may be inserted into the opening 318 of the core member 316 to secure the upper portion 302 and the lower portion 304 together.

As further shown in FIG. 3D, when the insulator 218 is assembled, the guide wall(s) 312 may be at least partially inserted into channel(s) 322, and the guide wall(s) 320 may be at least partially inserted into channel(s) 314. This may form an internal cavity 330 of the insulator 218. The internal cavity 330 may function as a channel between the core member 316 and an outer surface of the guide wall 312a and an outer surface of the guide wall 320a. The internal cavity 330 may provide a flow path 332 having a back and forth pattern from the outer surface of the guide wall 312a and the outer surface of the guide wall 320a to the core member 316. The back and forth pattern may extend along the cross-section of the insulator 218. The back and forth pattern may include a plurality of straight sections and curves or bends such that the straight sections double back on each other from the outer surface of the guide wall 312a and the outer surface of the guide wall 320a to the core member 316. In other examples, the internal cavity 330 may be shaped and/or configured such that the flow path 332 is zig-zag shaped, sinusoid shaped, square wave shaped, sawtooth shaped, or takes on another shape.

In some implementations, the spacing between a guide wall 312 and an adjacent guide wall 320, when the insulator 218 is assembled, may be greater than 0.5 millimeters to increase the electrical isolation between the extraction electrode voltage and the arc voltage. In some implementations, guide wall(s) 312 and guide wall(s) 320 may be evenly spaced or may have different spacing.

The back and forth pattern of the flow path 332 of the internal cavity 330 increases the mean free path of gas molecules (e.g., ion gas molecules, supply material gas molecules) in the internal cavity 330. The increased mean free path may decrease the likelihood that the gas molecules in the supply chamber 202 of the ion source head 106 will stick to the guide wall(s) 312 and 320 in the internal cavity 330. Moreover, the back and forth pattern of the flow path 332 of the internal cavity 330 increases the surface area of the insulator that is not directly or outwardly exposed to the gas molecules in the supply chamber 202 of the ion source head 106. This results in a continuous film or coating of the gas molecules being more difficult and/or less likely to form from one end of the insulator to another end. Accordingly, the back and forth pattern of the flow path 332 of the internal cavity 330 decreases the likelihood that a leakage path will form along the insulator between the extraction voltage conductor 214 connected to a first end of the insulator 218 and a component of the ion source head 106, connected to a second opposing end of the insulator 218, that is at the electrical potential of the arc voltage.

The number and arrangement of components shown in FIGS. 3A-3D are provided as an example. In practice, the insulator 218 may include additional components, fewer components, different components, or differently arranged components than those shown in FIGS. 3A-3D. Additionally, or alternatively, a set of components (e.g., one or more components) of the insulator 218 may perform one or more functions described as being performed by another set of components of the insulator 218. Moreover, while some implementations are described herein in connection with an ion implantation system, the insulator 218 described herein may be used in ion source heads of other types of systems, such as mass spectrometers, particle accelerators, and other types of systems that employ an ion source head.

Figure 4:
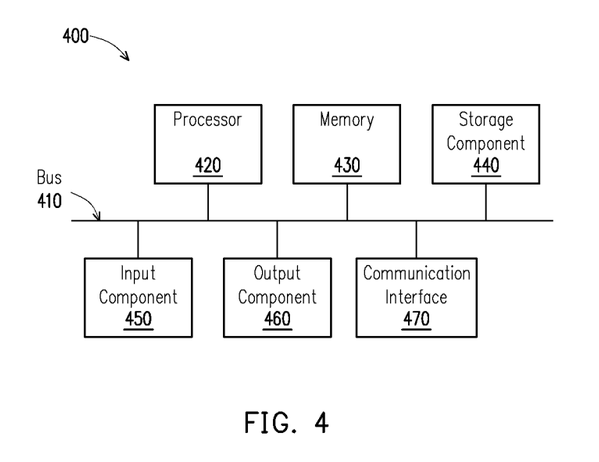
FIG. 4 is a diagram of example components of one or more devices of FIG. 1.

FIG. 4 is a diagram of example components of a device 400. In some implementations, power supply 102a, power supply 102b, and/or other components of ion implantation system 100 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

In this way, an insulator for an ion implantation source may provide electrical insulation between high voltage components and relatively lower voltage components of the ion implantation source. To reduce the likelihood of and/or prevent a leakage path forming along the insulator, the insulator may include an internal cavity having a back and forth pattern. The back and forth pattern of the internal cavity increases the mean free path of gas molecules in the ion implantation source and increases the surface area of the insulator that is not directly or outwardly exposed to the gas molecules. This results in a continuous film or coating being more difficult and/or less likely to form along the insulator, which extends the working time of the ion implantation source.

As described in greater detail above, some implementations described herein provide an insulator for an ion implantation source. The insulator includes a first portion and a second portion. The first portion includes a first plurality of guide walls, a first plurality of channels formed by the first plurality of guide walls, and a core member. The second portion includes a second plurality of guide walls and a second plurality of channels formed by the second plurality of guide walls. A combination of the first plurality of guide walls, the first plurality of channels, the second plurality of guide walls, and the second plurality of channels form a third channel to the core member when the core member is at least partially inserted into the second portion.

As described in greater detail above, some implementations described herein provide an ion source head. The ion source head includes an extraction electrode. The ion source head includes an extraction voltage conductor to supply an extraction voltage to the extraction electrode. The ion source head includes an insulator, disposed between the extraction voltage conductor and a portion of the ion source head that is at an electric potential of an arc voltage of the ion source head, to provide electrical isolation between the extraction voltage conductor and the portion of the ion source head. The insulator comprises an internal cavity, having a back and forth pattern from an outer surface to a core member, to prevent a gas in a supply chamber of the ion source head from forming a leakage path between the extraction voltage conductor and the portion of the ion source head.

As described in greater detail above, some implementations described herein provide an ion implantation system. The ion implantation system includes a first power supply to provide an extraction electrode voltage to an ion source head. The ion implantation system includes a second power supply to provide an arc voltage to the ion source head. The ion implantation system includes a gas source to provide a supply gas to the ion source head. The ion implantation system includes the ion source head. The ion source head includes an insulator to electrically isolate the extraction electrode voltage and the arc voltage. A first portion of the insulator and a second portion of the insulator form an internal channel in the insulator that includes a plurality of paths to prevent at least one of the supply gas or a plasma generated from the supply gas from coating the insulator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An insulator for an ion implantation source, comprising:
 a first portion, comprising:
  a flange,
  a first plurality of guide walls extending from a first surface of the flange,
  a first plurality of channels formed by the first plurality of guide walls,
  one or more first openings positioned about a perimeter of the flange,
   wherein the one or more first openings are configured to secure the first portion to an ion source head at a first end of the first portion,
  a second opening at a center of a second surface of the flange and at the first end,
   wherein the second surface of the flange opposes the first surface of the flange, and
   wherein the second opening is configured to secure the first portion to the ion source head at the first end, and
  a core member comprising a third opening at a second end of the first portion opposing the first end,
   wherein the third opening is configured to secure the first portion to the ion source head at the second end, and
   wherein the second opening is in line with the core member; and
 a second portion, comprising:
  a stepped section,
  a fourth opening, in the stepped section, configured to secure the first portion and the second portion together with a fastener,
  a second plurality of guide walls extending from the stepped section,
  a second plurality of channels formed by the second plurality of guide walls, and
  a recess formed internally in the stepped section,
   wherein, when the first portion and the second portion are combined:
    the fastener is inserted through the fourth opening and into the third opening to secure the first portion and the second portion together,
    the core member is at least partially inserted into the recess, and
    the first plurality of guide walls, the first plurality of channels, the second plurality of guide walls, and the second plurality of channels form a third channel to the core member when the core member is at least partially inserted into the recess, wherein, in a cross-sectional view of the third channel:
the first plurality of guide walls and the second plurality of guide walls are parallel to the core member,
the third channel comprises at least four straight sections between the core member and an outermost guide wall of the first plurality of guide walls and the second plurality of guide walls, and
core member.

2. The insulator of claim 1, wherein the first plurality of guide walls are a first plurality of concentric guide walls;
wherein the first plurality of channels are a first plurality of concentric channels;
wherein the second plurality of guide walls are a second plurality of concentric guide walls; and
wherein the second plurality of channels are a second plurality of concentric channels.

3. The insulator of claim 1, wherein the third channel is formed when at least a subset of the first plurality of guide walls are at least partially inserted into at least a subset of the second plurality of channels and at least a subset of the second plurality of guide walls are at least partially inserted into at least a subset of the first plurality of channels.

4. The insulator of claim 1, wherein a width of each of the first plurality of channels and a width of each of the second plurality of channels are greater than 1 millimeter.

5. The insulator of claim 1, wherein a width of a channel of the first plurality of channels and a width of a channel of the second plurality of channels are different widths.

6. The insulator of claim 1, wherein a spacing between a guide wall of the first plurality of guide walls and a guide wall of the second plurality of guide walls is greater than 0.5 millimeters.

7. The insulator of claim 1, wherein the third channel forms a back and forth pattern from an outer surface of the first portion to the core member.

8. The insulator of claim 1, wherein the core member is longer than the first plurality of guide walls.

9. The insulator of claim 1, wherein the one or more first openings extend through the flange.

10. The insulator of claim 1, wherein the first plurality of guide walls are square shaped.

11. The insulator of claim 1, wherein the first plurality of guide walls are triangle shaped.

12. The insulator of claim 1, wherein the second plurality of guide walls are square shaped.

13. The insulator of claim 1, wherein the second plurality of guide walls are triangle shaped.

14. An ion source head, comprising:
an extraction electrode;
an extraction voltage conductor to supply an extraction voltage to the extraction electrode; and
an insulator, disposed between the extraction voltage conductor and a portion of the ion source head that is at an electric potential of an arc voltage of the ion source head, to provide electrical isolation between the extraction voltage conductor and the portion of the ion source head,
wherein the insulator comprises a first portion, a second portion, and an internal cavity formed when the first portion and the second portion are combined,
wherein a core member of the first portion is at least partially inserted into a recess of the second portion when the first portion and the second portion are combined,
wherein the first portion further comprises a flange, a first plurality of guide walls extending from a first surface of the flange, a first plurality of channels formed by the first plurality of guide walls, one or more first openings positioned about a perimeter of the flange, and a second opening at a center of a second surface of the flange and at a first end of the first portion,
wherein the second surface of the flange opposes the first surface of the flange,
wherein the one or more first openings are configured to secure the insulator to the portion of the ion source head at the first end,
wherein the second opening is configured to secure the insulator to the portion of the ion source head at the first end,
wherein the core member comprises a third opening at a second end of the first portion opposing the first end,
wherein the third opening is configured to secure the insulator to the extraction voltage conductor at the second end, and
wherein the second opening is in line with the core member,
wherein the second portion further comprises a stepped section, a fourth opening, in the stepped section, configured to secure the first portion and the second portion together with a fastener, a second plurality of guide walls extending from the stepped section, a second plurality of channels formed by the second plurality of guide walls, and the recess formed internally in the stepped section,
wherein the fastener is inserted through the fourth opening and into the third opening to secure the first portion and the second portion together when the first portion and the second portion are combined,
wherein the first plurality of guide walls, the first plurality of channels, the second plurality of guide walls, and the second plurality of channels form a third channel to the core member when the core member is at least partially inserted into the recess,
wherein the internal cavity comprises the third channel with a back and forth pattern from the core member to an outermost guide wall of the first plurality of guide walls and the second plurality of guide walls to prevent a gas in a supply chamber of the ion source head from forming a leakage path between the extraction voltage conductor and the portion of the ion source head, and
wherein, in a cross-sectional view of the third channel:
the first plurality of guide walls and the second plurality of guide walls are parallel to the core member,
the third channel comprises at least four straight sections between the outermost guide wall and the core member, and
the at least four straight sections are parallel to the core member.

15. The ion source head of claim 14, wherein the first plurality of guide walls, the first plurality of channels, the second plurality of guide walls, and the second plurality of channels are circle-shaped.

16. The ion source head of claim 14, wherein the first plurality of guide walls, the first plurality of channels, the second plurality of guide walls, and the second plurality of channels are square-shaped.

17. The ion source head of claim 14, wherein the portion of the ion source head comprises:
 a wall of the supply chamber,
 a gas supply line in the supply chamber, or
 an arc voltage conductor in the supply chamber.

18. An ion implantation system, comprising:
 a first power supply to provide an extraction electrode voltage to an ion source head;
 a second power supply to provide an arc voltage to the ion source head;
 a gas source to provide a supply gas to the ion source head; and
 the ion source head, comprising:
  an insulator to electrically isolate the extraction electrode voltage and the arc voltage,
   wherein the insulator comprises:
    a first portion comprising a flange, a first plurality of guide walls extending from a first surface of the flange, a first plurality of channels formed by the first plurality of guide walls, one or more first openings positioned about a perimeter of the flange, a second opening at a center of a second surface of the flange and at a first end of the first portion, and a core member comprising a third opening at a second end of the first portion opposing the first end,
    wherein the second surface of the flange opposes the first surface of the flange,
    wherein the one or more first openings are configured to secure the first portion to the ion source head at the first end of the first portion,
    wherein the second opening is configured to secure the first portion to the ion source head at the first end,
    wherein the third opening is configured to secure the first portion to the ion source head at the second end, and
    wherein the second opening is in line with the core member, and
    a second portion comprising a stepped section, a fourth opening, in the stepped section, configured to secure the first portion and the second portion together with a fastener, a second plurality of guide walls extending from the stepped section, a second plurality of channels formed by the second plurality of guide walls, and a recess formed internally in the stepped section, and
   wherein, when the first portion of the insulator and the second portion of the insulator are combined:
    the fastener is inserted through the fourth opening and into the third opening to secure the first portion and the second portion together,
    the core member is at least partially inserted into the recess, and
    the first plurality of guide walls, the first plurality of channels, the second plurality of guide walls, and the second plurality of channels form a third channel to the core member when the core member is at least partially inserted into the recess,
    wherein, in a cross-sectional view of the third channel:
     the first plurality of guide walls and the second plurality of guide walls are parallel to the core member,
     the third channel comprises at least four straight sections between the core member and an outermost guide wall of the first plurality of guide walls and the second plurality of guide walls, and
     the at least four straight sections are parallel to the core member.

19. The ion implantation system of claim 18, wherein at least one of:
 a width of a first channel of the first plurality of channels and a width of a second channel of the first plurality of channels are different widths, or
 a width of a first channel of the second plurality of channels and a width of a second channel of the second plurality of channels are different widths.

20. The ion implantation system of claim 18, wherein:
 a first spacing between a first guide wall of the first plurality of guide walls and a first guide wall of the second plurality of guide walls is different from a second spacing between a second guide wall of the first plurality of guide walls and a second guide wall of the second plurality of guide walls.

* * * * *